US011131718B2

(12) United States Patent
Gan et al.

(10) Patent No.: US 11,131,718 B2
(45) Date of Patent: Sep. 28, 2021

(54) SYSTEMS AND METHODS FOR AUTOMATED TESTING OF POWER SUPPLY UNITS

(71) Applicant: Astec International Limited, Kowloon (HK)

(72) Inventors: Hui Guan Gan, Metro Manila (PH); Joselito Ramirez Lomat, Dasmarinas (PH); Ferdinand Acosta Mojica, Cavite (PH); Rombel Castro Dela Cruz, Cavite (PH)

(73) Assignee: Astec International Limited, Kowloon (HK)

( * ) Notice: Subject to any disclaimer, the term of this patent is extended or adjusted under 35 U.S.C. 154(b) by 260 days.

(21) Appl. No.: 16/044,214

(22) Filed: Jul. 24, 2018

(65) Prior Publication Data

US 2020/0033421 A1    Jan. 30, 2020

(51) Int. Cl.
| | | |
|---|---|---|
| *G01R 31/40* | (2020.01) | |
| *G01R 31/30* | (2006.01) | |
| *G06F 11/36* | (2006.01) | |
| *B25J 9/02* | (2006.01) | |
| *G01R 1/04* | (2006.01) | |

(52) U.S. Cl.
CPC ............... *G01R 31/40* (2013.01); *B25J 9/02* (2013.01); *G01R 1/04* (2013.01); *G01R 31/3004* (2013.01); *G06F 11/3688* (2013.01)

(58) Field of Classification Search
CPC .... G01R 31/40; G01R 31/42; G01R 31/3004; G01R 1/04; B25J 9/02; G06F 11/3688

USPC ..................................................... 324/764.01
See application file for complete search history.

(56) References Cited

U.S. PATENT DOCUMENTS

| | | | |
|---|---|---|---|
| 8,589,110 B2 | 11/2013 | Liu et al. | |
| 9,453,883 B2 | 9/2016 | DeLaPuente | |
| 2007/0063724 A1* | 3/2007 | Roberts | G01R 31/2893 324/750.16 |
| 2013/0007473 A1* | 1/2013 | van der Lee | G06F 1/3212 713/300 |
| 2013/0049794 A1* | 2/2013 | Humphrey | G01R 31/40 324/764.01 |
| 2016/0089793 A1* | 3/2016 | Truebenbach | B25J 15/0616 324/750.25 |
| 2018/0313890 A1* | 11/2018 | Wolff | G01R 31/2868 |
| 2020/0300923 A1* | 9/2020 | Li | G01R 31/40 |

* cited by examiner

*Primary Examiner* — Jeff W Natalini

(57) ABSTRACT

An automated testing system for power supply units includes a frame, automated test equipment supported by the frame, a test jig supported by the frame and coupled with the automated test equipment, and a robotic arm coupled to the frame. The robotic arm is configured to move a power supply unit onto the test jig to interface with the automated test equipment. The automated test equipment is configured to perform one or more tests on the power supply unit when the power supply unit is interfaced with the automated test equipment, and the robotic arm is configured to move the power supply unit off of the test jig after the one or more tests are completed. Methods of performing automated testing for power supply units are also disclosed.

18 Claims, 8 Drawing Sheets

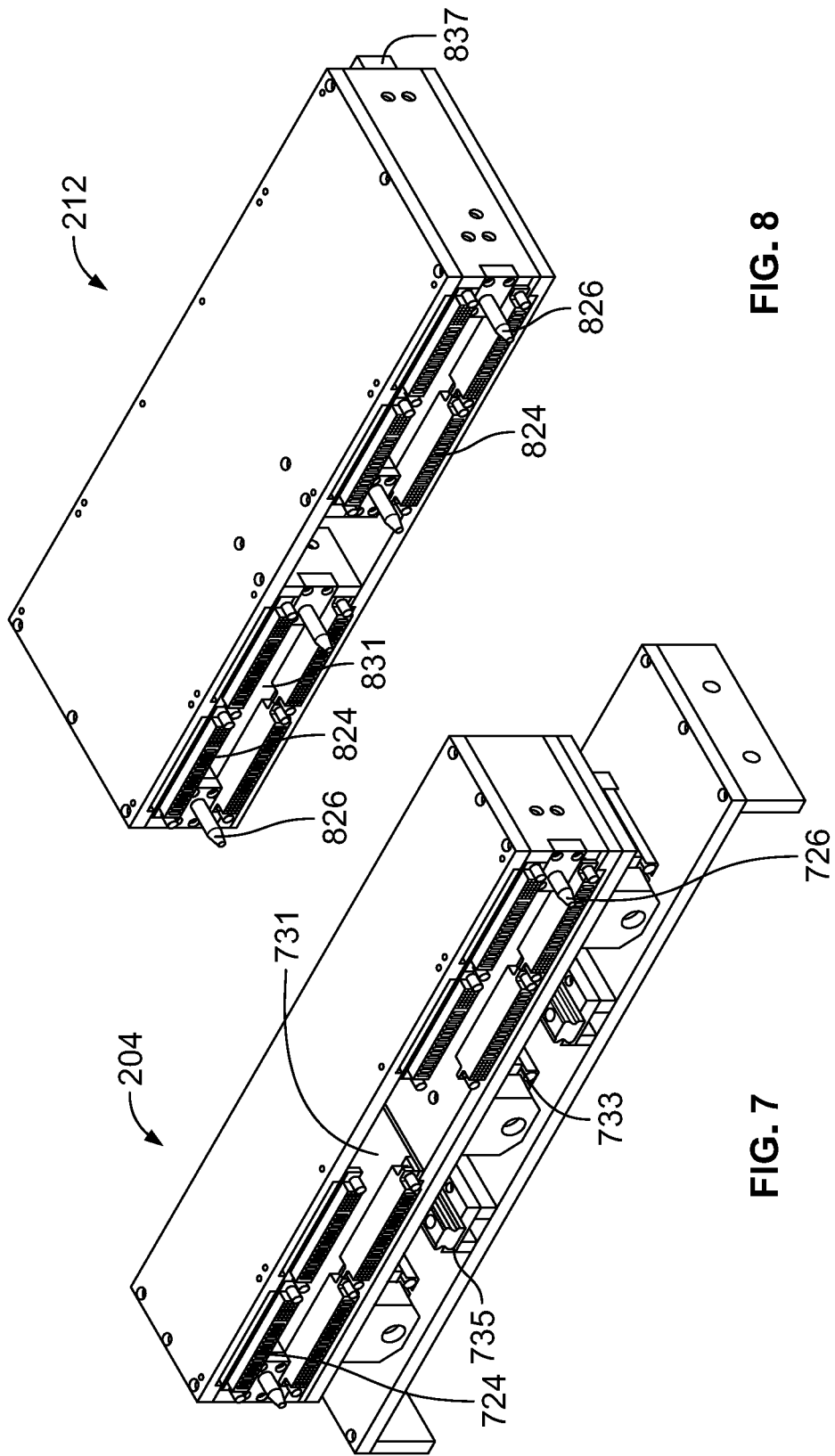

SYSTEMS AND METHODS FOR AUTOMATED TESTING OF POWER SUPPLY UNITS

FIELD

The present disclosure relates to systems and methods for automated testing of power supply units.

BACKGROUND

This section provides background information related to the present disclosure which is not necessarily prior art.

Conventional testing of power supply units requires manually transferring power supply units from a conveyor belt to a unique test jig designed especially for the specific model of power supply unit, where the power supply unit is electrically connected to automated test equipment.

When production is scheduled to convert to running a different model of power supply unit, current test jigs must be replaced with other test jigs that are unique to the new model of power supply unit. The setup and changeover process can take fifteen to thirty minutes to complete. During the changeover period, the automated test equipment is down and not usable for production.

SUMMARY

This section provides a general summary of the disclosure, and is not a comprehensive disclosure of its full scope or all of its features.

According to one aspect of the present disclosure, an automated testing system for power supply units includes a frame, automated test equipment supported by the frame, a test jig supported by the frame and coupled with the automated test equipment, and a robotic arm coupled to the frame. The robotic arm is configured to move a power supply unit onto the test jig to interface with the automated test equipment. The automated test equipment is configured to perform one or more tests on the power supply unit when the power supply unit is interfaced with the automated test equipment, and the robotic arm is configured to move the power supply unit off of the test jig after the one or more tests are completed.

According to another aspect of the present disclosure, an automated testing system for power supply units includes automated test equipment configured to perform one or more tests on a power supply unit, and multiple power supply interfaces for interfacing the power supply unit with the automated test equipment. Each of the power supply interfaces is adapted to interface a different power supply unit model with the automated test equipment. The automated test equipment is configured to identify a model of the power supply unit and to select a corresponding one of the power supply interfaces to interface with the identified model of the power supply unit.

According to yet another aspect of the present disclosure, a method of performing automated testing for power supply units is disclosed. The method includes identifying a model of a power supply unit in response to an RFID tag associated with the power supply unit, and obtaining, by automated test equipment, a test script corresponding to the identified model of the power supply unit. The method also includes performing, by the automated test equipment, one or more tests on the power supply unit as defined by the obtained test script corresponding to the identified model of the power supply unit.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7 is an isometric view of an automated test equipment interface of the automated testing system of FIG. 2.

FIG. 8 is an isometric view of a power supply interface of the automated testing system of FIG. 2.

Corresponding reference numerals indicate corresponding parts or features throughout the several views of the drawings.

DETAILED DESCRIPTION

Figure 1:
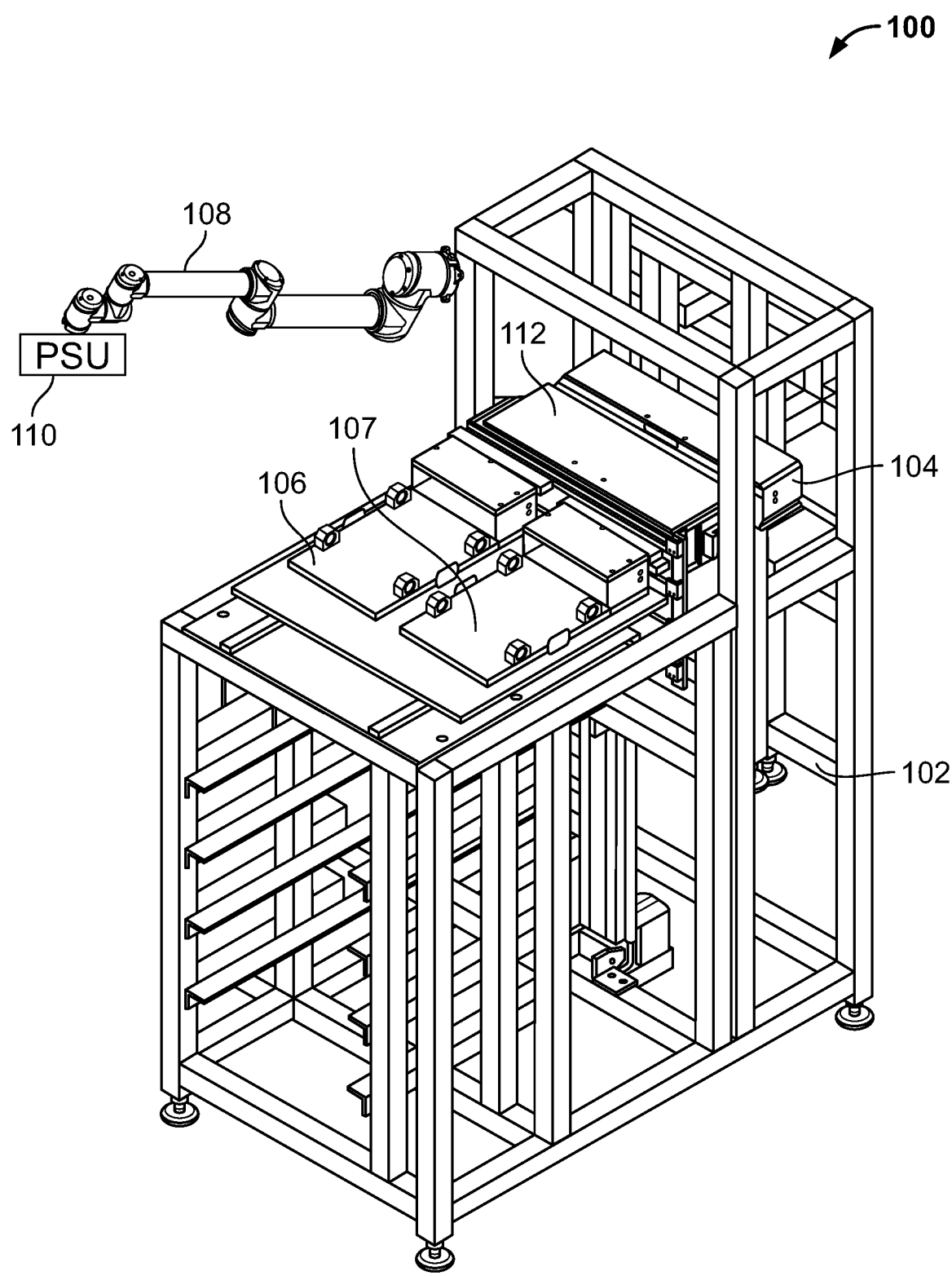
FIG. 1 is an isometric view of an automated testing system for power supply units, according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

An automated testing system for power supply units according to one example embodiment of the present disclosure is illustrated in FIG. 1 and indicated generally by reference number 100. The automated testing system 100 includes a frame 102, automated test equipment 104 supported by the frame 102, and a test jig 106 supported by the frame 102. The test jig 106 may be electrically coupled with the automated test equipment 104, mechanically coupled with the automated test equipment 104, etc.

The automated testing system 100 also includes a robotic arm 108 coupled to the frame 102. The robotic arm 108 is configured to move a power supply unit 110 onto the test jig 106 to interface with the automated test equipment 104.

The automated test equipment 104 is configured to perform one or more tests on the power supply unit 110 when the power supply unit 110 is interfaced with the automated test equipment 104. The robotic arm 108 is configured to move the power supply unit 110 off of the test jig 106 after the one or more tests are completed.

For example, multiple power supply units 110 may move along a conveyor belt during a manufacturing process, a testing process, etc. The robotic arm 108 can move the multiple power supply units from the conveyor belt to the test jig 106 one at a time, so the automated test equipment 104 can perform one or more tests on each power supply unit 110.

The robotic arm 108 can move each power supply unit 110 back to the conveyor belt after the one or more tests are completed. This may be considered as an in-line testing automation system. Although FIG. 1 illustrates a single robotic arm 108, other embodiments may include more than one robotic arm to move multiple power supplies at the same time, etc.

The automated testing system 100 illustrated in FIG. 1 includes two test jigs 106 and 107 (e.g., a left jig and a right jig). In other embodiments, automated testing systems may include only one test jig, more than two test jigs, etc. In the automated testing system 100 of FIG. 1, the robotic arm 108 can move a first power supply unit 110 onto the test jig 106 to start automated testing of the first power supply unit 110. The robotic arm 108 may then move a second power supply unit onto the other test jig 107 while the first power supply unit 110 is interfaced with the automated test equipment 104.

The second power supply unit in test jig 107 may be considered as "on standby" while the automated test equipment 104 is performing the test(s) on the first power supply unit 110. Once the automated test equipment 104 completes the test(s) on the first power supply unit 110 positioned on the test jig 106, the automated test equipment 104 can disengage from the first power supply unit 110 and interface with the second power supply unit positioned on the test jig 107 to perform test(s) on the second power supply.

At that point, the robotic arm 108 can replace the first power supply unit 110 on the test jig 106 with a third power supply unit, while the automated test equipment 104 is performing test(s) on the second power supply unit on the test jig 107. Once the automated test equipment 104 completes the test(s) on the second power supply unit positioned on the test jig 107, the automated test equipment 104 can switch back to perform test(s) on the third power supply unit located on the test jig 106. A power supply unit may be considered as a unit under test (UUT) while test(s) are performed on the power supply unit.

When a test is completed, robotic arm 108 can move a power supply unit to a next station. If a UUT has reached a last station, robotic arm 108 can move the unit to a "pass location" such as a pass conveyor belt, etc. If a power supply unit fails the test(s), the unit can be moved to a "reject location" such as a reject conveyor belt, etc. In view of the above, the automated test equipment 104 may run substantially continuously with reduced downtime, reduced change over time, etc.

The automated testing system 100 may include an optional power supply interface 112 for interfacing the power supply unit 110 with the automated test equipment 104. In some embodiments, the automated testing system 100 can include multiple power supply interfaces 112 for interfacing power supply units with the automated test equipment 104, where each of the power supply interfaces 112 is adapted to interface a different power supply unit model with the automated test equipment 104.

For example, and as described further below, the automated testing system 100 could include an elevator and the multiple power supply interfaces 112 could be supported by the elevator. In that case, the elevator can be configured to align a corresponding one of the power supply interfaces 112 between the automated test equipment 104 and the power supply unit 110 in response to an identified model of the power supply unit 110.

In some embodiments, the power supply unit 110 is associated with a radio-frequency identification (RFID) tag. The automated test equipment 104 can be configured to identify a model of the power supply unit 110 via the RFID tag, and obtain a test script corresponding to the identified model of the power supply unit 110.

For example, the power supply unit 110 may be placed (manually or automatically) on a universal carrier on a conveyor belt, and the universal carrier may include an RFID tag identifying the model of the power supply unit 110. As the power supply unit 110 passes a sensor, the automated test equipment 104 can identify the model of the power supply unit based on the RFID tag and obtain a corresponding test script. Alternatively, or in addition, a barcode could be placed on the power supply unit 110 and scanned by a sensor.

The automated test equipment 104 could be configured to obtain the test script corresponding to the identified model of the power supply unit 110 by downloading the test script from a server. Alternatively, or in addition, multiple test scripts could be stored in a memory of the automated test equipment 104, and the automated test equipment 104 could select a corresponding automated test equipment 104 from memory in response to the identified model of the power supply unit 110, etc.

As mentioned above, the automated testing system 100 may include multiple power supply interfaces 112 each adapted to interface the automated test equipment 104 with a different power supply unit model. The automated test equipment 104 can be configured to select a corresponding one of the power supply interfaces 112 for interfacing with the identified model of the power supply unit 110.

As described further below, each power supply interface 112 may include an input/output (I/O) card that electrically connects the power supply unit 110 to the automated test equipment 104 for the automated test equipment 104 to perform test(s) on the power supply unit 110.

For example, as a new model of power supply unit is loaded onto a conveyor belt, the automated test equipment 104 can detect that there is a different model of power supply unit (e.g., via RFID, barcode scanning, etc.) and automatically change the power supply interface 112 to select one corresponding to the new model of power supply unit. The automated testing system 100 can have multiple power supply interfaces 112 on standby to support multiple different power supply models that will be running on the production line.

As described above, the automated test equipment 104 may also download a corresponding test script (e.g., from a server, from memory, etc.) for performing test(s) on the new model of power supply unit. The automated test equipment 104 may perform any suitable power supply unit tests, including a voltage regulation test, a digital output test, a PSU communication test, power supply unit protection features such as over-current protection (OCP), over-voltage protection (OVP), over-power protection (OPP), output short-circuit protection, etc.

The inventors have recognized that conventional approaches where unique test jigs are changed for each different power supply model can limit efficiency and capacity of the production line, and require increased space to store all of the different unique test jigs. When test jigs are in storage for an extended period of time, they may require maintenance before the test jigs are reintroduced to the production line. In addition, one or more test engineers or technicians (e.g., test operators) are required to handle the changeover between different unique test jigs for different models of power supply units. The test operators also have to manually upload different test scripts to the automated test equipment for each different model of power supply unit.

Features of automated testing systems described herein can overcome these problems by allowing the automated testing systems to run with reduced (e.g., approximately zero) change-over loss for a production line, even where the production line is running with low volume high mixes, where the production line requires multiple change overs of power supply unit models within a shift, etc. The automated testing systems, which may be considered as dynamic universal testing systems, can allow several different models of power supply units to run on a production line (e.g., a conveyor belt) simultaneously. The whole testing process may be automated, so no test operator is required.

In some embodiments, the automated test equipment 104 is able to test more than one power supply unit at a time. The automated test equipment 104 may accomplish this through multiplexing. The number of power supply units that the automated test equipment can test at one time may depend on rated output power of the power supply units, power handling capability of the automated test equipment 104, etc.

For example, in a single unit test a switch control unit may be directly connected to a power supply unit under test (UUT) via a test interface. The switch control unit can control switching of test points with respect to test equipment that will process measurement data.

In a multiplexing setup, the switch control unit may be directly connected to a multiplexer circuit that controls multiple relays responsible for sequentially connecting multiple power supply units to an AC source, etc. Each power supply unit may be connected to a different electronic load, and the multiplexer can connect components of the switch control unit (e.g., a digital voltmeter, a digital oscilloscope, etc.) to the power supply units sequentially in correspondence with the relays to perform tests on each power supply unit in a multiplexed manner. This can decrease a cycle time for testing multiple power supply units by eliminating some or all of handling time that would otherwise be required during testing.

Example systems described herein may be used for testing any suitable power supply unit products. In some embodiments, the systems may be designed to accommodate any power supply unit within a 30 cm by 30 cm form factor. In other embodiments, the range for power supply unit size could be larger or smaller.

Figure 2:
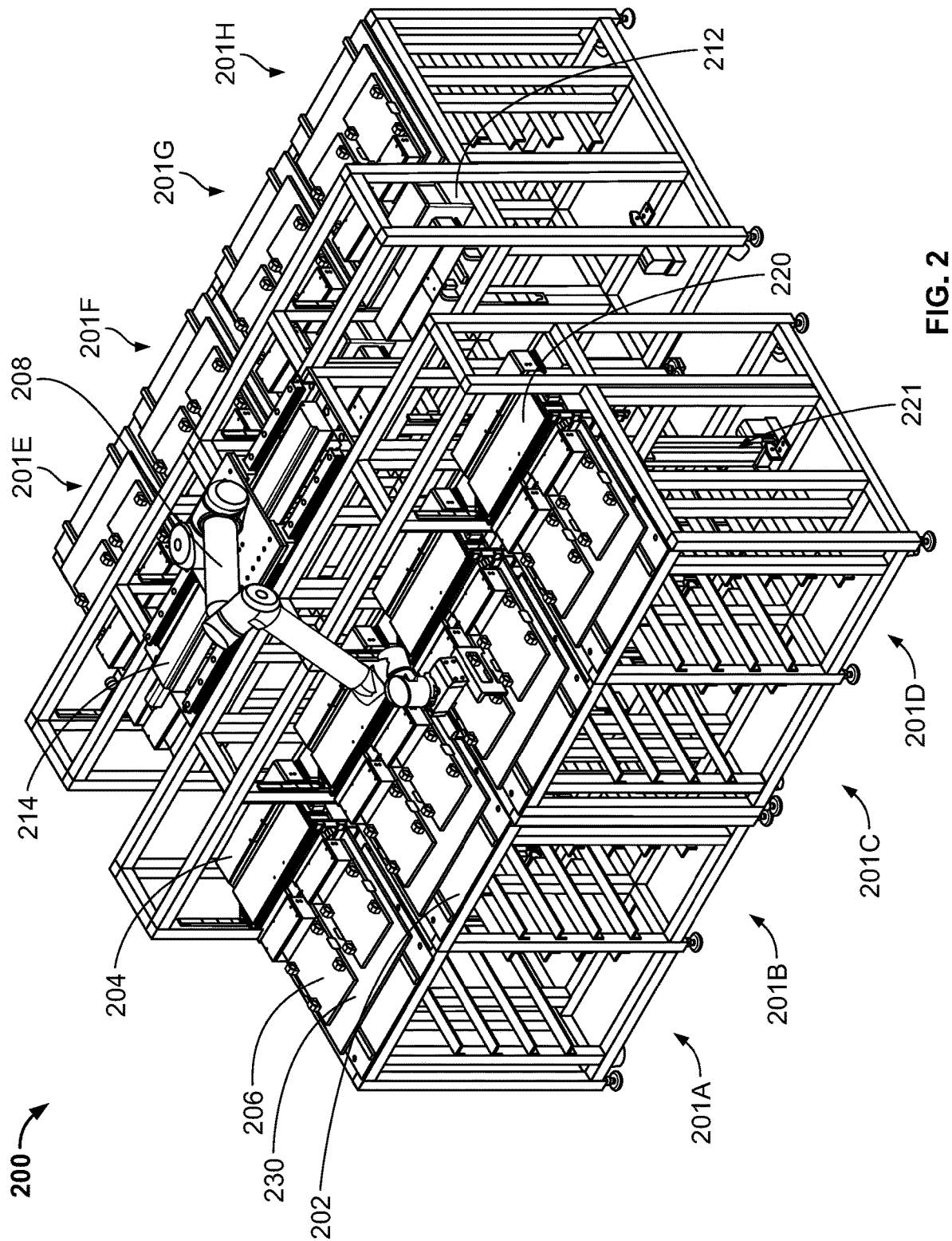
FIG. 2 is an isometric view of an automated testing system for power supply units including multiple testing stations, according to another example embodiment of the present disclosure.

FIG. 2 illustrates an automated testing system 200 for power supply units, according to another example embodiment of the present disclosure. The system 200 includes eight testing stations 201A, 201B, 201C, 201D, 201E, 201F, 201G and 201H, each of which may be similar to the system 100 illustrated in FIG. 1. The eight testing stations can be electro-mechanically integrated as described further below.

The automated testing system 200 can multiplex testing among multiple power supply units on the different testing stations 201A, 201B, 201C, 201D, 201E, 201F, 201G and 201H. For example, a different power supply unit may be positioned at a test jig 206 on each testing station 201A, 201B, 201C, 201D, 201E, 201F, 201G and 201H.

Automated test equipment 204 may interface with each power supply unit on the test jigs 206 of the testing stations 201A, 201B, 201C, 201D, 201E, 201F, 201G and 201H to perform one or more tests on each power supply unit in a multiplexed manner. For example, the automated test equipment 204 may perform the test(s) on each power supply unit individually in a sequential manner, man perform the test(s) on each power supply unit in parallel, etc.

Each testing station 201A, 201B, 201C, 201D, 201E, 201F, 201G and 201H includes a second test jig 207, which can be used to hold another power supply unit on standby. Once the automated test equipment 204 completes the test(s) on each power supply unit in the test jigs 106 of the testing stations 201A, 201B, 201C, 201D, 201E, 201F, 201G and 201H, the automated test equipment 204 may perform test(s)

on the power supply units located in the test jigs 207. The power supply units with completed tests in the test jigs 206 are then replaced with new power supply units, to provide substantially continuous testing by the automated test equipment 204.

As shown in FIG. 2, the automated test equipment 204 includes an interface at each testing station 201A, 201B, 201C, 201D, 201E, 201F, 201G and 201H. The automated test equipment 204 may be located at a single position in the automated testing system 200 and electrically connected to each interface via wires, etc., the automated test equipment 204 may be distributed to each testing station 201A, 201B, 201C, 201D, 201E, 201F, 201G and 201H, etc.

Figure 4:
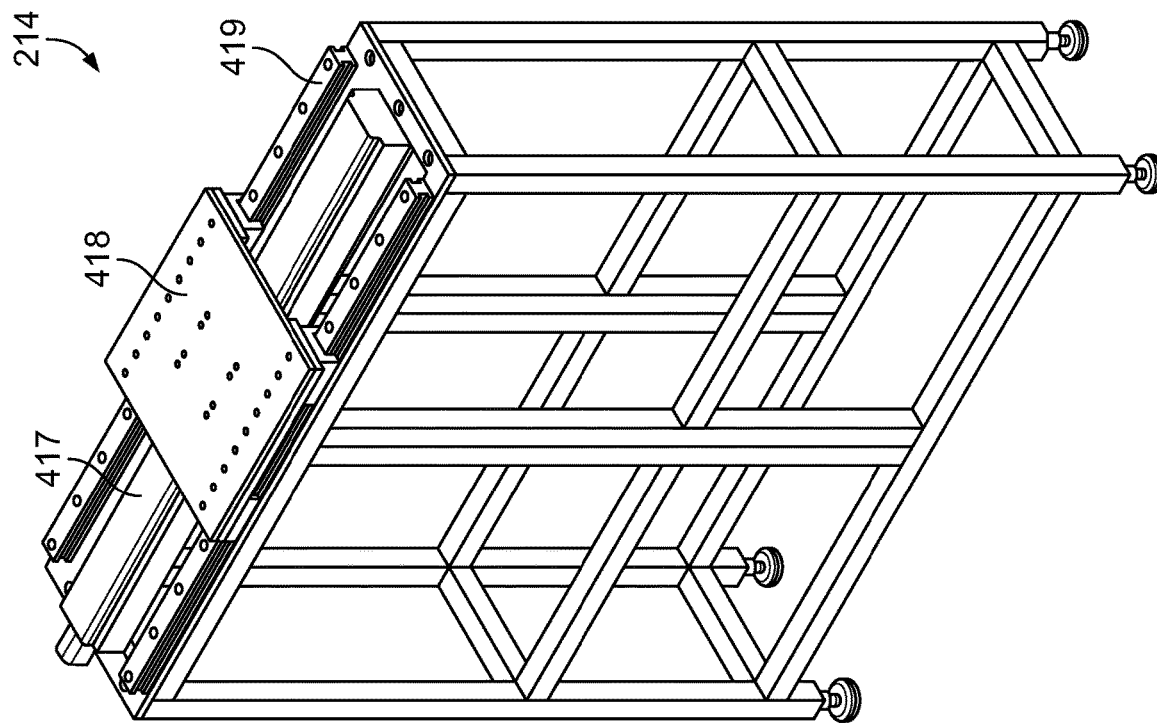
FIG. 4 is an isometric view of the traverse of the automated testing system of FIG. 2.
Figure 3:
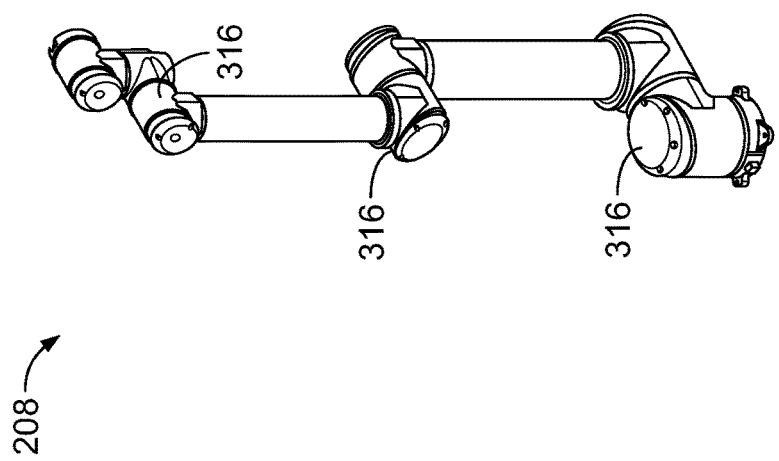
FIG. 3 is an isometric view of the robotic arm of the automated testing system of FIG. 2.

The system 200 also includes a robotic arm 208 coupled to a traverse 214, which are shown individually in FIGS. 3 and 4. As described above, the robotic arm 208 may transport a power supply unit (and optionally a pallet carrying the power supply unit) to a test jig 206 or 207.

For example, the robotic arm 208 may transport the power supply unit from an input conveyor belt (e.g., a production line) for testing, and then transport the power supply unit back to the same conveyor belt, to a different output conveyor belt, to a sorting station, etc. after the testing is completed.

The robotic arm 208 can be any electro-mechanical device suitable for transporting power supply units to and from the test jigs 206 and 207 (e.g., pick and place, etc.). As shown in FIG. 3, the robotic arm 208 includes multiple joints 316, and multiple joints 316 may each have a single axis of movement/rotation, multiple axes of movement/rotation, etc. In other embodiments the robotic arm 208 may have more or less joints 316, the automatic testing system 200 may have more than one robotic arm, no robotic arms (where power supply units are transported to and from the jigs 206 and 207 via different means such as a magnetic conveyor), etc. One example robotic arm is the UR10 robotic arm manufactured by UNIVERSAL ROBOTS.

FIG. 4 illustrates the traverse 214. The traverse 214 is a mechanical sub-assembly including a base 418 for supporting the robotic arm 208. The traverse 214 allows the robotic arm 208 to move to different positions along the traverse 214, to extend the reach of the robotic arm 208 to access different testing stations 201A, 201B, 201C, 201D, 201E, 201F, 201G and 201H.

As shown in FIG. 4, a ball screw actuator 419 can move the base 418 along a linear guide of the traverse 214. This can extend movement range of power supply units, a pallet 622 (See FIG. 6), etc. In some embodiments, a conveyor may be used in addition to, or instead of, the traverse 214.

Although FIGS. 2 and 4 illustrate a single traverse 214 having a single base 418, other embodiments may include more than one traverse 214 or more than one base 418 per traverse (particularly when the automated testing system 200 includes more than one robotic arm 208), no traverse 214 (where power supply units are transported to and from the test jigs 206 and 207 via different means), etc. One example traverse is the UR10 traverse manufactured by UNIVERSAL ROBOTS.

Figure 5:
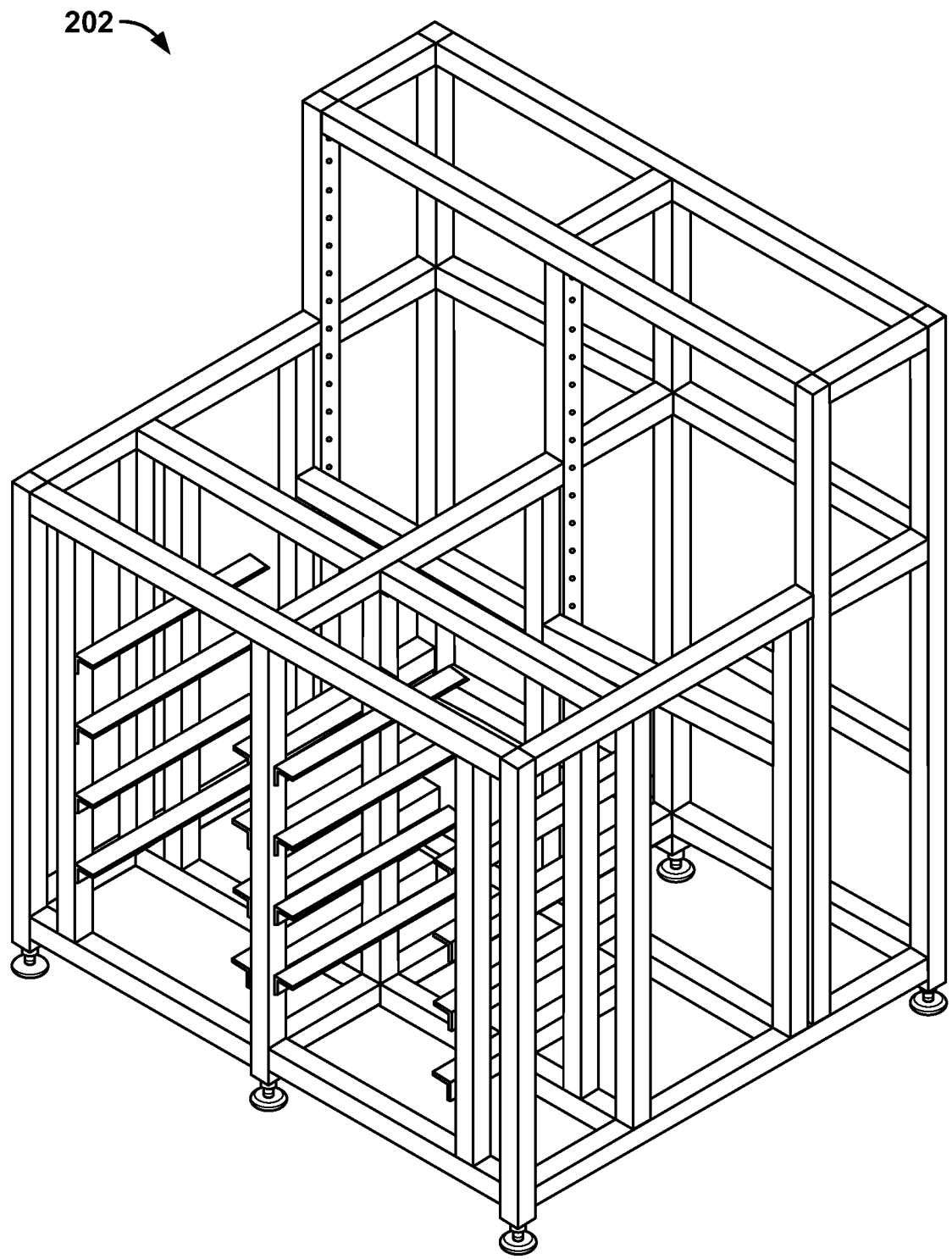
FIG. 5 is an isometric view of the frame of the automated testing system of FIG. 2.

FIG. 5 illustrates a frame 202 (e.g., support frame) of the automated testing system 200. As shown in FIG. 2, the mechanical frame 202 can support any or all of the other components of the system 200, including the robotic arm 208, the traverse 214, the test jigs 206 and 207, the automated test equipment interface 204, an elevator 220 for power supply interfaces 212, a pallet base 230, etc.

Figure 6:
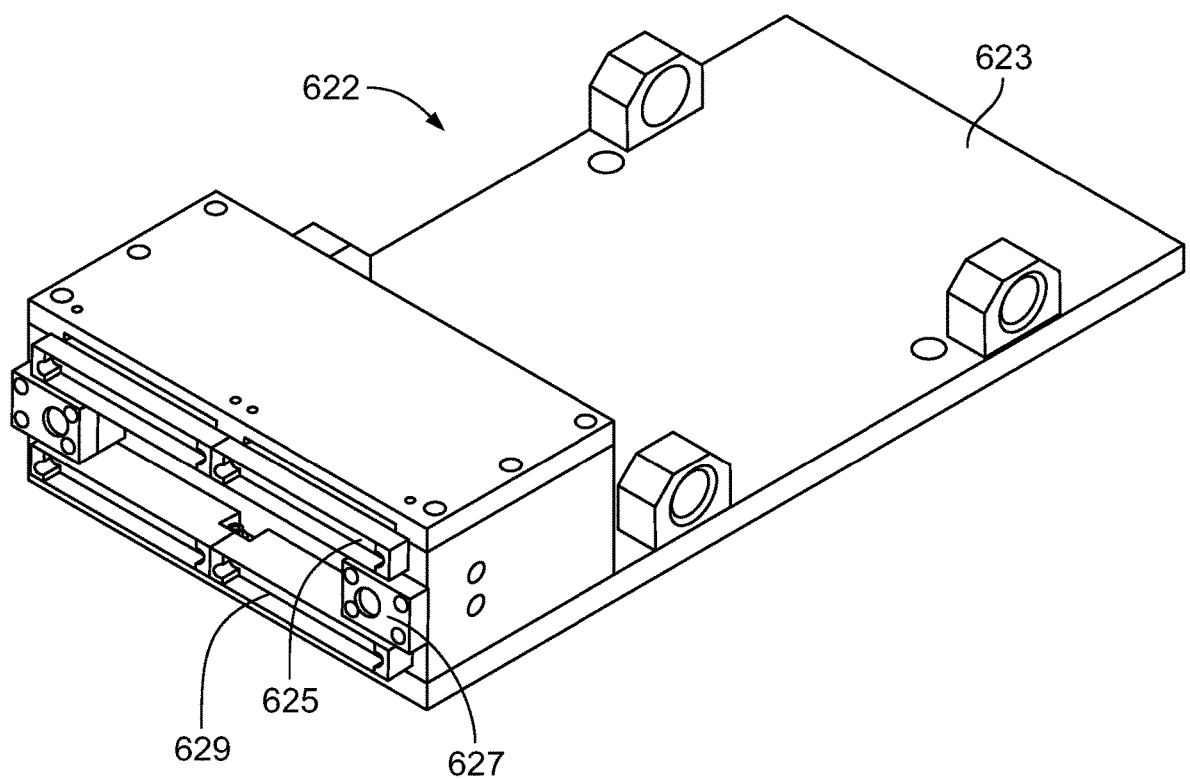
FIG. 6 is an isometric view of a pallet of the automated testing system of FIG. 2.

FIG. 6 illustrates a pallet 622. Each power supply unit may be loaded on a pallet 622 during production (e.g., for transportation along a conveyor belt, for transportation by the robotic arm 208 to a test jig 206 or 207, etc.). For example, the robotic arm 208 may pick up a power supply unit from an input conveyor belt and place the power supply unit on the pallet 622. Therefore, the pallet 622 may be a mechanical assembly that holds a power supply unit and can be transported from one test station to another during the testing process. In some cases, the pallet 622 may form part of a test jig 206 or 207.

The pallet 622 includes a unit base 623, an interface connector 625, a dowel guide hole 627 and a connector interface printed circuit board (PCB) 629. In some cases, the pallet 622 may include an RFID tag that identifies a model of power supply unit carried by the pallet 622. The automated test equipment interface 204 and/or other component of the automated testing system 200 may select corresponding test script(s), select a corresponding power supply interface 212, etc. based on the RFID tag of the pallet 622.

The pallet 622 may be sized, shaped, etc. depending on the power supply unit carried by the pallet 622. In some cases, the pallet 622 can be sized, shaped, etc. to accommodate a variety of power supply models. One example dimension of the pallet 622 is about 200 mm by 400 mm, although pallets having larger or smaller dimensions can also be used.

FIG. 7 illustrates an automated test equipment interface 204 shown in FIG. 2. The automated test equipment interface 204 includes interface connectors 724 coupled to an interface connector PCB 731, for interfacing with a power supply interface 212. The automated test equipment interface 204 also includes a pneumatic cylinder 733 for moving the automated test equipment interface 204 along a linear guide 735.

Dowel guides 726 may align, secure, etc. the automated test equipment interface 204 to a corresponding power supply interface 212 (e.g., based on an identified power supply unit model). The interface connectors 724 can provide an electrical connection for the automated test equipment interface 204 to perform test(s) on a power supply unit (e.g., via the power supply interface 212).

In some embodiments, the automated testing system 200 may be connected to a network server for program and data storage. The automated testing system 200 may use a computer, microprocessor, programmable logic controller (PLC), etc. for running testing program(s), providing electro-mechanical control, etc.

A power supply interface 212 (e.g., interface module) is shown in FIG. 8. The power supply interface 212 includes interface connectors 824, an interface connector PCB 831, and dowel guides 826 for interfacing with a power supply unit. For example, the dowel guides 826 may align, secure, etc. the power supply interface 212 to a power supply unit. The power supply interface 212 also includes a dowel guide hole 837 for interfacing with the automated test equipment interface 204, etc.

The electrical connectors 824 can provide an electrical connection for the automated test equipment interface 204 to perform test(s) on the power supply unit (via the power supply interface 212). Each power supply interface 212 may be unique to a specific type of power supply unit, and may include wiring, circuitry, etc. corresponding to electrical specifications of the specific type of power supply unit.

As shown in FIG. 8, the power supply interface 212 includes two sets of pins 826 and electrical connectors 824. The two sets allow the power supply interface 212 to interface with two different power supply units each located on a different one of the test jigs 206 and 207 at one of the testing stations 201A, 201B, 201C, 201D, 201E, 201F, 201G and 201H. In other embodiments, the power supply interface 212 could include more pins and electrical connectors, less pins and electrical connectors, etc.

Figure 9:
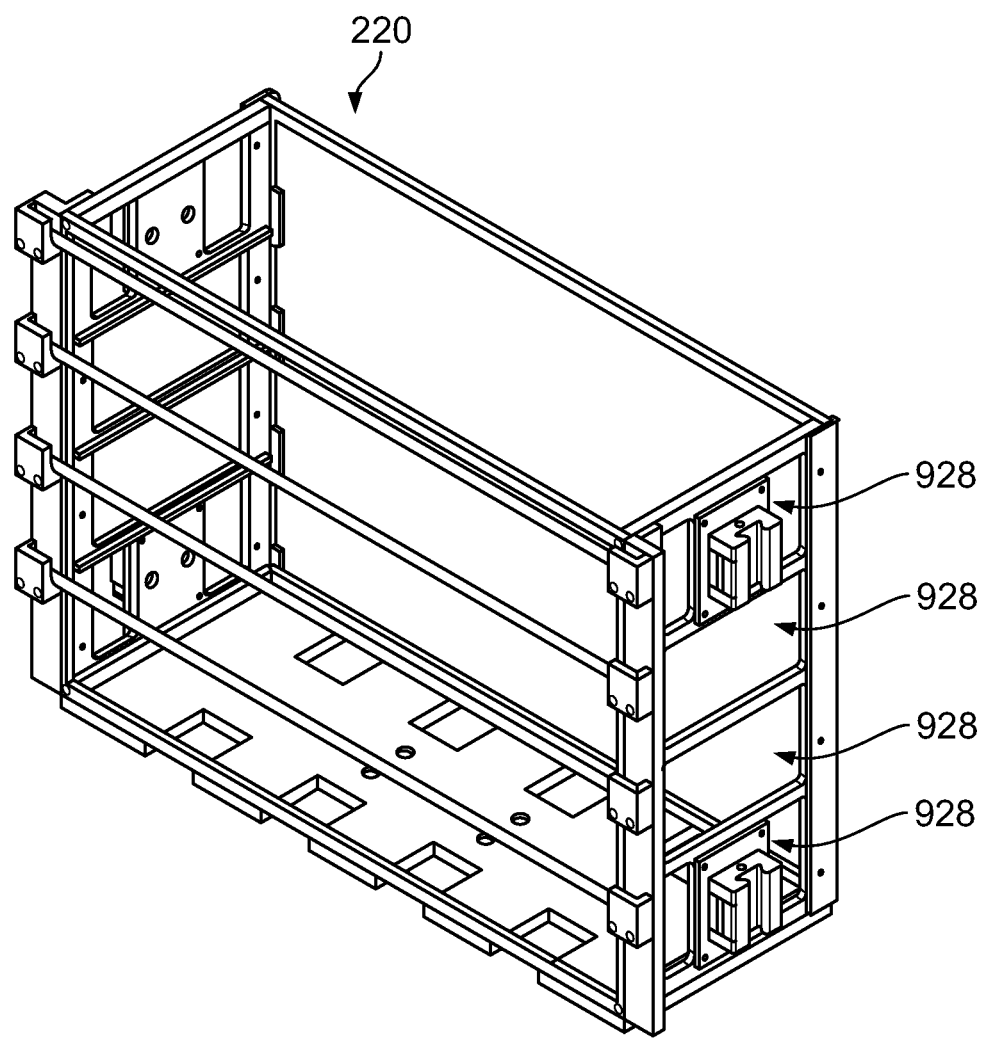
FIG. 9 is an isometric view of an elevator of the automated testing system of FIG. 2.

FIG. 9 illustrates an elevator 220 of the automated testing system 200 of FIG. 2. The elevator 220 can change between different power supply interfaces 212 depending on an identified model of power supply unit currently selected for testing by the automated test equipment interface 204.

For example, the elevator 220 includes four bays 928, which may hold four different power supply interfaces 212 each corresponding to one of four different power supply unit models. The elevator 220 can move up and down to select the correct power supply interface 212 for the current power supply unit, to align the selected power supply interface 212 between the power supply unit and the automated test equipment interface 204. The elevator 220 may include a ball screw actuator 221 (See FIG. 2) for moving the elevator 220 up and down. Alternatively, or in addition, the elevator may be moved by a pneumatic cylinder when selecting a specific power supply interfaces 212 for testing.

Although FIG. 9 illustrates four bays 928, other embodiments may include more or less than four bays, to carry more or less than four power supply interfaces 212. The number of bays and/or power supply interfaces on each elevator 220 may be determined based on a maximum number of possible power supply unit models during a production run.

The elevator 220 moves vertically to select between different power supply interfaces. In other embodiments, the elevator 220 could move horizontally, could rotate circularly, a different selection mechanism other than an elevator could be used to select between different power supply interfaces, etc.

Figure 10:
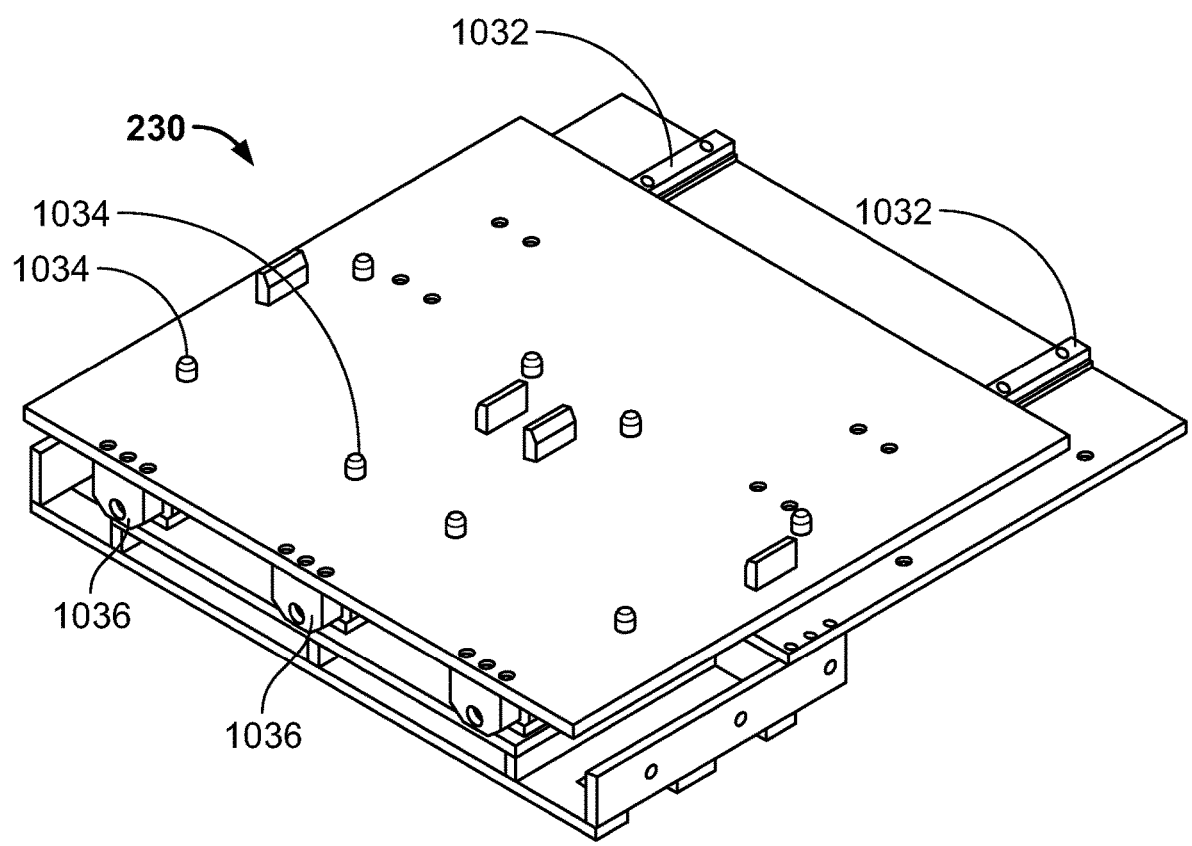
FIG. 10 is an isometric view of a pallet base of the automated testing system of FIG. 2.

FIG. 10 illustrates a pallet base 230 of the automated testing system 200 of FIG. 2. The pallet base 230 is adapted to support one or more pallets 622 that are loaded onto the pallet base 230, during at testing process. For example, the pallet base 230 could accept two pallets 622 corresponding to test jigs 206 and 207.

The pallet base 230 can include multiple dowel guides 1034 to align the pallets 622 when the pallets 622 are loaded on the pallet base 230. This may facilitate correct alignment between the pallet 622 and a power supply interface 212. The pallet base 230 may also include linear guide(s) 1032 and a pneumatic cylinder 1036 to move the pallet base 230. The pallet base 230 can have any suitable size, shape, etc. For example, the pallet base 230 could have dimensions of about 200 mm by about 400 mm, although pallet bases having larger or smaller dimensions could also be used.

A program of the automated testing system 200 may sense a presence of a power supply unit under test (UUT) if slots in the pallet base 230 are already fully occupied. Once fully occupied, the program of the automated testing system 200 may command the pallet base 230 to engage with the automated test equipment interface 204, and then command a computer to execute the power supply unit testing procedures. After the tests are completed, the program may update a status of the tests, store test results in a network server, etc.

According to another example embodiment, an automated testing system for power supply units includes automated test equipment configured to perform one or more tests on a power supply unit, and multiple power supply interfaces for interfacing the power supply unit with the automated test equipment.

Each of the power supply interfaces is adapted to interface a different power supply unit model with the automated test equipment. The automated test equipment is configured to identify a model of the power supply unit, and to select a corresponding one of the power supply interfaces to interface with the identified model of the power supply unit.

In some cases, the multiple power supply interfaces include at least four power supply interfaces to interface at least four different power supply unit models with the automated test equipment.

The automated testing system may include an elevator, with each of the power supply interfaces supported by the elevator. The elevator can be configured to align the corresponding one of the power supply interfaces between the automated test equipment and the power supply unit in response to the identified model of the power supply unit.

In some embodiments, the power supply unit is associated with a radio-frequency identification (RFID) tag, and the automated test equipment is configured to identify the model of the power supply unit via the RFID tag. The automated test equipment can configured to obtain a test script corresponding to the identified model of the power supply unit. For example, the automated test equipment may be configured to obtain the test script corresponding to the identified model of the power supply unit by downloading the test script from a server.

As described herein, the example automated test equipment, robotic arms, elevators, etc. may include a microprocessor, microcontroller, integrated circuit, digital signal processor, etc., which may include memory. The automated test equipment, robotic arms, elevators, etc. may be configured to perform (e.g., operable to perform, etc.) any of the example processes described herein using any suitable hardware and/or software implementation. For example, the automated test equipment, robotic arms, elevators, etc. may execute computer-executable instructions stored in a memory, may include one or more logic gates, control circuitry, etc.

According to another example embodiment, a method of performing automated testing for power supply units is disclosed. The method includes identifying a model of a power supply unit in response to an RFID tag associated with the power supply unit, and obtaining, by automated test equipment, a test script corresponding to the identified model of the power supply unit.

The method also includes performing, by the automated test equipment, one or more tests on the power supply unit as defined by the obtained test script corresponding to the identified model of the power supply unit. Obtaining the test script corresponding to the identified model of the power supply unit may include downloading the test script from a server.

In some embodiments, the method further includes selecting a corresponding one of multiple power supply interfaces each adapted to interface the automated test equipment with a different power supply unit model, in response to the identified model of the power supply unit, and interfacing the automated test equipment with the power supply unit via the selected corresponding one of the multiple power supply interfaces.

Example embodiments described herein may provide one or more (or none) of the following advantages: reduction or elimination of manual power supply unit handling, manual test jig change-over, and manual test script uploading by a test operator; substantially continuous runtime of the automated test equipment and production line; reduction or elimination of changeover downtime for different power supply unit models; universal testing that allows for different models to be run on the same production line without changing test jigs; reduction or elimination of the cost and time required to fabricate a unique test jig for each model of power supply unit; saved storage space from unneeded unique test jigs, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An automated testing system for power supply units, the system comprising:
   a frame;
   automated test equipment supported by the frame;
   a test jig supported by the frame and coupled with the automated test equipment;
   multiple power supply interfaces each adapted to interface the automated test equipment with a different power supply unit model; and
   a robotic arm coupled to the frame, the robotic arm configured to move a power supply unit onto the test jig to interface with the automated test equipment;
   wherein the automated test equipment is configured to identify a model of the power supply unit to be moved onto the test jig, select one of the multiple power supply interfaces that corresponds to the identified model of the power supply unit, and perform one or more tests on the power supply unit when the power supply unit is interfaced with the automated test equipment via the selected one of the multiple power supply interfaces; and
   wherein the robotic arm is configured to move the power supply unit onto the test jig to interface with the selected power supply interface and to move the power supply unit off of the test jig after the one or more tests are completed.

2. The automated testing system of claim 1, wherein the test jig is a first test jig and the power supply unit is a first power supply unit, the system further comprising a second test jig, the robotic arm configured to move a second power supply unit to the second jig while the first power supply unit is interfaced with the automated test equipment, the automated test equipment configured to perform the one or more tests on the second power supply unit after completing the one or more tests on the first power supply unit.

3. The automated testing system of claim 2, wherein the robotic arm is configured to replace the first power supply unit in the first jig with a third power supply unit while the second power supply unit is interfaced with the automated test equipment, and the automated test equipment is configured to perform the one or more tests on the third power supply unit after completing the one or more tests on the second power supply unit.

4. The automated testing system of claim 1, wherein the multiple power supply interfaces include at least four power supply interfaces to interface at least four different power supply unit models with the automated test equipment.

5. The automated testing system of claim 1, further comprising an elevator supported by the frame, each of the power supply interface supported by the elevator, the elevator configured to align a corresponding one of the power supply interfaces between the automated test equipment and the power supply unit in response to an identified model of the power supply unit.

6. The automated testing system of claim 1, wherein the power supply unit is associated with a radio-frequency identification (RFID) tag, and the automated test equipment is configured to identify the model of the power supply unit via the RFID tag and obtain a test script corresponding to the identified model of the power supply unit.

7. The automated testing system of claim 6, wherein the automated test equipment is configured to obtain the test script corresponding to the identified model of the power supply unit by downloading the test script from a server.

8. The automated testing system of claim 1, wherein the power supply unit is one of multiple power supply units along a conveyor belt, the robotic arm is configured to move the multiple power supply units from the conveyor belt to the test jig one at a time, and the robotic arm is configured to move each power supply unit back to the conveyor belt after the one or more tests are completed for said power supply unit.

9. The automated testing system of claim 1, wherein the test jig includes a pallet adapted to receive the power supply unit while the power supply unit is interfaced with the automated test equipment.

10. An automated testing system for power supply units, the system comprising:
    automated test equipment configured to perform one or more tests on a power supply unit;
    multiple power supply interfaces for interfacing the power supply unit with the automated test equipment, each of the power supply interfaces adapted to interface a different power supply unit model with the automated test equipment; and
    a robotic arm;
    wherein the automated test equipment is configured to:
       identify a model of the power supply unit to be interfaced with the automated test equipment; and
       select a corresponding one of the power supply interfaces to interface with the identified model of the power supply unit; and
    wherein the robotic arm is configured to interface the corresponding one of the power supply interfaces with the identified model of the power supply unit.

11. The automated testing system of claim 10, wherein the multiple power supply interfaces include at least four power supply interfaces to interface at least four different power supply unit models with the automated test equipment.

12. The automated testing system of claim 10, further comprising an elevator, each of the power supply interfaces coupled to the elevator, the elevator configured to align the corresponding one of the power supply interfaces between the automated test equipment and the power supply unit in response to the identified model of the power supply unit.

13. The automated testing system of claim 10, wherein the power supply unit is associated with a radio-frequency identification (RFID) tag, and the automated test equipment is configured to identify the model of the power supply unit via the RFID tag.

14. The automated testing system of claim 13, wherein the automated test equipment is configured to obtain a test script corresponding to the identified model of the power supply unit.

15. The automated testing system of claim 14, wherein the automated test equipment is configured to obtain the test script corresponding to the identified model of the power supply unit by downloading the test script from a server.

16. A method of performing automated testing for power supply units, the method comprising:
- identifying a model of a power supply unit in response to an RFID tag associated with the power supply unit;
- obtaining, by automated test equipment, a test script corresponding to the identified model of the power supply unit;
- selecting, by the automated test equipment, one of multiple power supply interfaces that corresponds to the identified model of the power supply unit, each of the multiple power supply interfaces adapted to interface the automated test equipment with a different power supply unit model;
- controlling a robotic arm to interface the automated test equipment with the power supply unit via the selected corresponding one of the multiple power supply interfaces; and
- performing, by the automated test equipment, one or more tests on the power supply unit as defined by the obtained test script corresponding to the identified model of the power supply unit.

17. The method of claim 16, wherein obtaining the test script corresponding to the identified model of the power supply unit includes downloading the test script from a server.

18. The method of claim 16, wherein the multiple power supply interfaces include at least four power supply interfaces to interface at least four different power supply unit models with the automated test equipment.

* * * * *